United States Patent

Matsuhira (10) Patent No.: US 10,222,712 B2
(45) Date of Patent: Mar. 5, 2019

(54) CONVEYANCE APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Yasunao Matsuhira, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/472,432

(22) Filed: Mar. 29, 2017

(65) Prior Publication Data

US 2017/0285492 A1  Oct. 5, 2017

(30) Foreign Application Priority Data

Mar. 31, 2016  (JP) ................. 2016-073179

(51) Int. Cl.
G03F 7/20  (2006.01)

(52) U.S. Cl.
CPC ........ G03F 7/70725 (2013.01); G03F 7/7075 (2013.01); G03F 7/70783 (2013.01)

(58) Field of Classification Search
CPC ............... G03F 7/70725; G03F 7/7075; G03F 7/70783; G03F 9/7011; H01L 21/67703
USPC ............................. 355/72, 77; 414/935, 936
See application file for complete search history.

(56) References Cited

U.S. PATENT DOCUMENTS

| | | | | |
|---|---|---|---|---|
| 5,870,488 A | * | 2/1999 | Rush | H01L 21/67271 382/151 |
| 6,236,904 B1 | * | 5/2001 | Nakamura | H01L 21/67259 414/331.14 |
| 9,195,129 B2 | | 11/2015 | Endo | |
| 2003/0082466 A1 | * | 5/2003 | del Puerto | G03F 7/707 430/22 |
| 2006/0216025 A1 | * | 9/2006 | Kihara | G03F 7/70783 396/611 |
| 2008/0267741 A1 | * | 10/2008 | Nagasaka | H01L 21/6838 414/217 |

FOREIGN PATENT DOCUMENTS

| | | | |
|---|---|---|---|
| JP | 2000114345 A | | 4/2000 |
| JP | 2004151102 A | | 5/2004 |
| JP | 2005260010 A | | 9/2005 |
| JP | 2005311113 A | * | 11/2005 |
| JP | 2007189211 A | * | 7/2007 |
| JP | 2011146663 A | | 7/2011 |
| KR | 20100074345 A | * | 7/2010 |

* cited by examiner

Primary Examiner — Colin Kreutzer
(74) Attorney, Agent, or Firm — Rossi, Kimms & McDowell LLP (57) ABSTRACT

The present invention provides a conveyance apparatus which conveys a substrate to a stage, the apparatus comprising a holding unit configured to hold and rotate the substrate, a detection unit configured to detect a height of the substrate held by the holding unit, a conveyance unit configured to convey the substrate from the holding unit to the stage, and a control unit configured to control, based on a detection result of the detection unit obtained while the holding unit rotates the substrate, conveyance of the substrate by the conveyance unit.

21 Claims, 10 Drawing Sheets

CONVEYANCE APPARATUS, LITHOGRAPHY APPARATUS, AND METHOD OF MANUFACTURING ARTICLE

BACKGROUND OF THE INVENTION

Field of the Invention

The present invention relates to a conveyance apparatus, a lithography apparatus, and a method of manufacturing an article.

Description of the Related Art

Along with an increase in the integration degree of semiconductor devices, multilayering of circuit patterns progresses. In a substrate where the circuit patterns are multilayered, a distortion may be accumulated due to stacked circuit patterns, causing warpage. Then, a lithography apparatus may further form a circuit pattern also on a substrate where the warpage is caused as described above.

Japanese Patent Laid-Open No. 2005-260010 discloses a method of controlling a height at which an arm (conveyance unit) is inserted into a cassette in accordance with the warpage amount of a substrate detected by a sensor in order to prevent the substrate from contacting the cassette when the arm unloads the substrate from the cassette or loads the substrate into the cassette.

In the lithography apparatus, when the substrate where the warpage occurs is conveyed to a substrate stage, the substrate may also contact a member in the lithography apparatus and be damaged depending on the magnitude of the warpage of the substrate. It is therefore preferable in the lithography apparatus that the substrate is conveyed to the substrate stage so as to avoid the substrate from contacting the member in the lithography apparatus after grasping the warpage (shape) of the substrate.

SUMMARY OF THE INVENTION

The present invention provides, for example, a technique advantageous in avoiding damage to a substrate.

According to one aspect of the present invention, there is provided a conveyance apparatus which conveys a substrate to a stage, the apparatus comprising: a holding unit configured to hold and rotate the substrate; a detection unit configured to detect a height of the substrate held by the holding unit; a conveyance unit configured to convey the substrate from the holding unit to the stage; and a control unit configured to control, based on a detection result of the detection unit obtained while the holding unit rotates the substrate, conveyance of the substrate by the conveyance unit.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given. A conveyance apparatus according to the present invention can be applied to, for example, a lithography apparatus such as an imprint apparatus which forms a pattern of an imprint material (resist) on a substrate by using a die, an exposure apparatus which forms a latent pattern of the resist on the substrate by projecting a pattern formed in a reticle on the substrate, or a drawing apparatus which draws the latent pattern of the resist on the substrate by irradiation with laser beams or charged particle beams. In embodiments described below, an explanation will be given using the imprint apparatus which forms the pattern in the imprint material on the substrate by using a mold.

First Embodiment

An imprint apparatus according to the first embodiment of the present invention will be described. The imprint apparatus is used to manufacture a semiconductor device or the like and performs an imprint process of forming a pattern in an imprint material on a substrate by using a mold. For example, the imprint apparatus supplies the imprint material onto the substrate, and brings the mold and the imprint material supplied onto the substrate into contact with each other. Then, in a state in which the mold and the imprint material on the substrate are in contact with each other, the imprint apparatus cures the imprint material and separates the mold (release the mold) from the cured imprint material. This makes it possible to form the pattern in the imprint material on the substrate. The imprint apparatus of this embodiment can include a patterning unit 10 shown in FIG. 1 which forms the pattern on the substrate and a conveyance apparatus 20 shown in FIG. 2 which conveys the substrate to the patterning unit 10 (stage 12).

Figure 1:
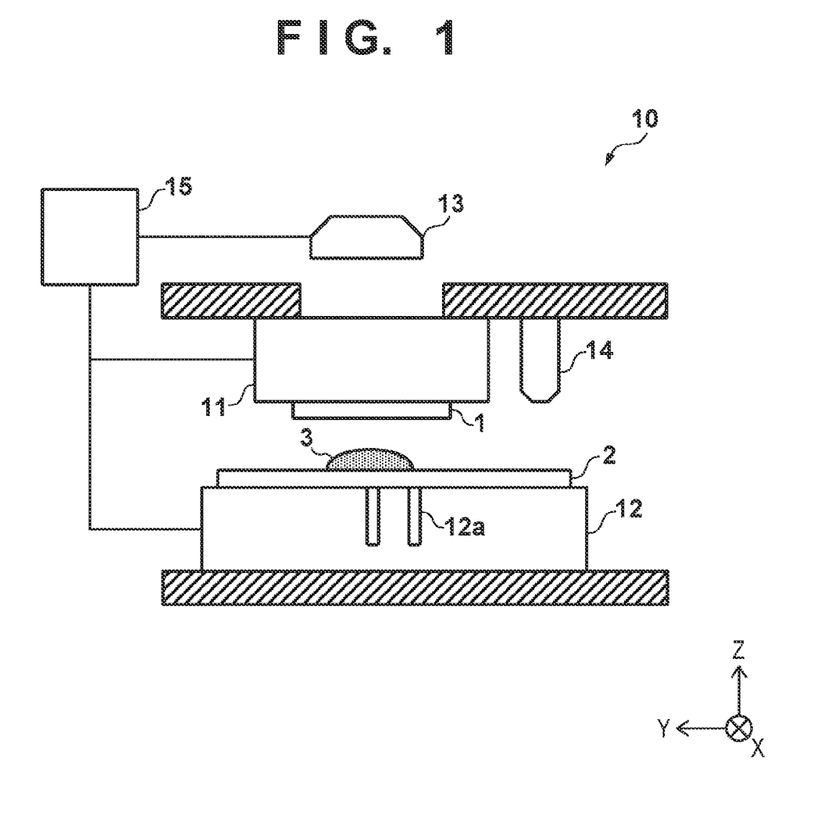
FIG. 1 is a view showing the arrangement of a patterning unit in an imprint apparatus.

FIG. 1 is a schematic view showing the arrangement of the patterning unit 10 in the imprint apparatus. The patterning unit 10 includes, for example, an imprint head 11, the stage 12 (substrate stage), an irradiation unit 13, a supply unit 14, and a control unit 15 and performs the imprint process of forming the pattern in an imprint material 3 on the substrate by using a mold 1. The control unit 15 includes, for example, a CPU, a memory, and the like and controls the imprint process.

The imprint head 11 holds the mold 1 by a vacuum chuck force or the like and drives the mold 1 at least in a Z direction (mold pressing direction) so as to bring the mold 1 and the imprint material 3 on the substrate into contact with each other or separating them from each other. The mold 1 held by the imprint head 11 is made of a material, such as quartz or the like, capable of transmitting light for curing the imprint material 3 and has an area in which a three-dimensional pattern that should be transferred to the imprint material 3 on the substrate is formed.

The stage 12 is configured to hold a substrate 2 by a vacuum chuck force or the like and to be movable in X and Y directions (directions perpendicular to the mold pressing direction). The substrate 2 held by the stage 12 is, for example, a semiconductor substrate, a glass substrate, or the like and is conveyed onto the stage by the conveyance apparatus 20 to be described later. For example, the stage 12 includes pins 12a (for example, three pins 12a) capable of protruding from a surface (holding surface) on which the substrate 2 is held and protrudes the pins 12a from the holding surface when transferring the substrate 2 from a second conveyance unit 21b to be described later onto the stage. Then, when the conveyance apparatus 20 (second conveyance unit 21b) transfers the substrate 2 onto the pins 12a, the stage 12 reduces the protrusion amount of the pins 12a from the holding surface. This transfers the substrate 2 from the pins 12a onto the holding surface of the stage 12. The stage 12 sucks and holds the arranged substrate 2.

In the state in which the mold 1 and the imprint material 3 on the substrate are in contact with each other, the irradiation unit 13 irradiates the imprint material 3 on the substrate with light (ultraviolet light) for curing the imprint material 3 via the mold 1. The imprint apparatus of this embodiment adopts a photo-curing method, and thus the irradiation unit 13 which emits light is used. When a heat cycle method is adopted, however, a heat source can be provided instead of the irradiation unit 13. The supply unit 14 supplies (applies) the imprint material 3 onto the substrate. In the imprint apparatus of this embodiment, an ultraviolet-curing resin having the property of being cured by light (ultraviolet light) irradiation can be used as the imprint material 3.

Figure 2:
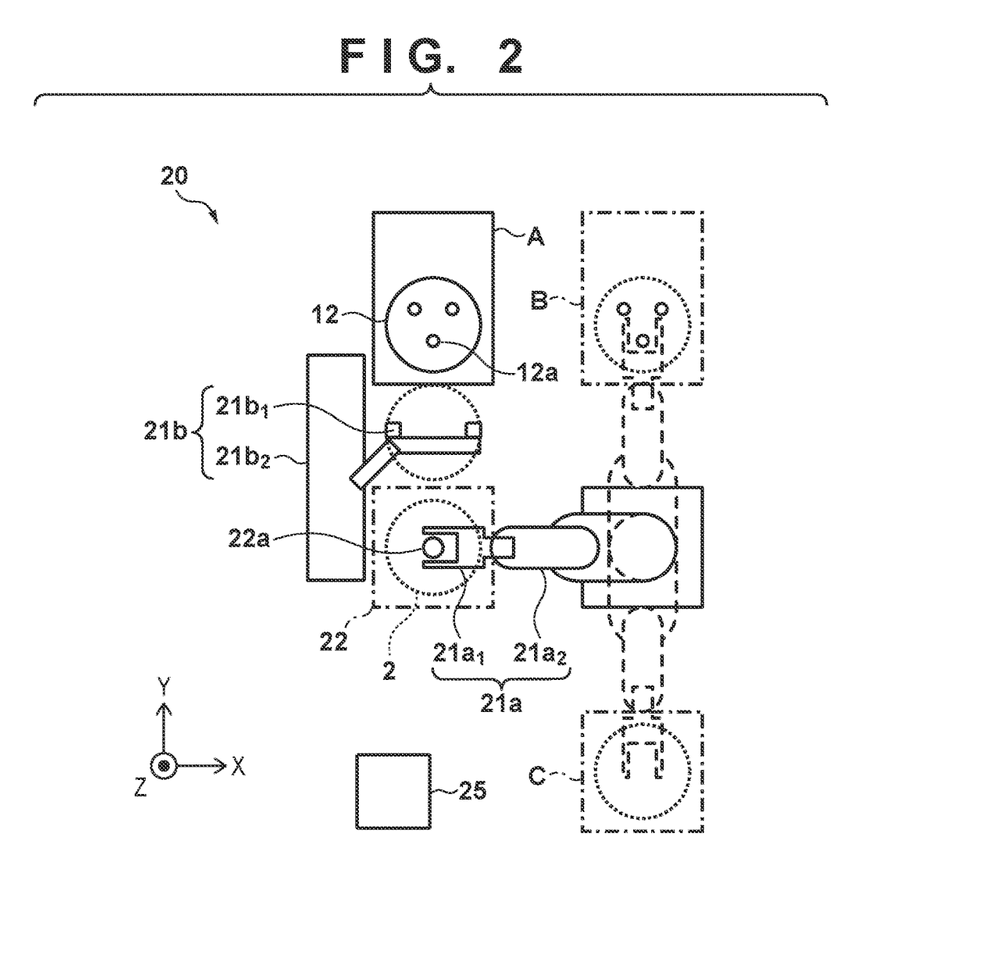
FIG. 2 is a view showing a conveyance apparatus as viewed from the top (Z direction)
Figure 3:
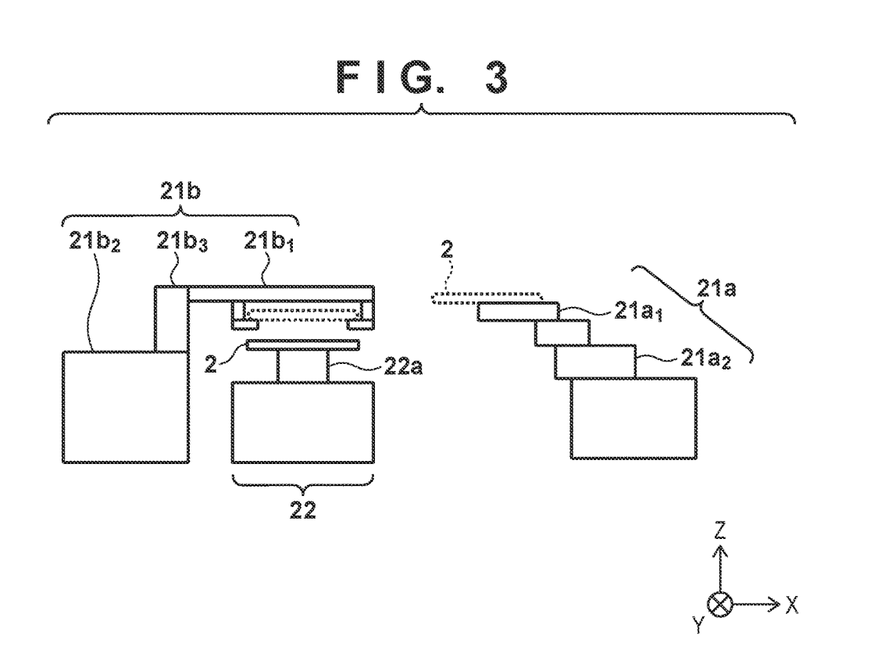
FIG. 3 is a view showing the conveyance apparatus as viewed from the side (−Y direction)

The conveyance apparatus 20 included in the imprint apparatus will now be described with reference to FIGS. 2 and 3. FIG. 2 is a schematic view showing the conveyance apparatus 20 as viewed from the top (+Z direction). FIG. 3 is a schematic view showing the conveyance apparatus 20 (the periphery of a PA unit 22) as viewed from the side (−Y direction). The conveyance apparatus 20 can include a conveyance unit 21 which conveys the substrate 2, the pre-alignment unit 22 (also referred to as an alignment apparatus or a processing unit, and will be referred to as the PA unit 22 hereinafter) which performs a process of detecting the edge of the substrate 2, and a control unit 25. Then, the conveyance apparatus 20 conveys, by the conveyance unit 21, the substrate 2 from a standby position C at which the substrate loaded into the apparatus stands by to a loading position A at which the stage 12 is arranged via the PA unit 22. After the substrate 2 is arranged on the stage 12 at the loading position A, the stage 12 moves such that the substrate 2 is arranged under the mold 1. Then, after the imprint process for the substrate 2 on the stage 12 is terminated, the stage 12 moves to an unloading position B, and the conveyance unit 21 conveys the substrate on the stage 12 from the unloading position B to the standby position. At the standby position C, the plurality of substrates 2 are contained in a cassette for each lot.

Note that the conveyance unit 21 of this embodiment can include, for example, a first conveyance unit 21a which conveys the substrate 2 from the standby position C to the PA unit 22 and the second conveyance unit 21b which conveys the substrate 2 from the PA unit 22 to the loading position A (on the stage 12). That is, the conveyance unit which conveys the substrate 2 from the standby position C to the PA unit 22 and the conveyance unit which conveys the substrate 2 from the PA unit 22 to the loading position A (on the stage 12) are different from each other. However, the present invention is not limited to this. A common conveyance unit may convey the substrate 2 from the standby position C to the PA unit 22 and convey the substrate 2 from the PA unit 22 to the loading position A. For example, without providing the second conveyance unit 21b in the conveyance apparatus 20, the first conveyance unit 21a may convey the substrate 2 both from the standby position C to the PA unit 22 and from the PA unit 22 to the loading position A. Further, in this embodiment, the control unit 15 of the patterning unit 10 and the control unit 25 of the conveyance apparatus 20 are arranged separately. However, they may be arranged integrally.

The first conveyance unit 21a conveys the substrates 2 contained in the cassette at the standby position C to the PA unit 22 (on a holding unit 22a) one by one. The first conveyance unit 21a can include, for example, a hand $21a_1$ which holds the substrate 2 and an arm $21a_2$ which drive the hand $21a_1$. The hand $21a_1$ of the first conveyance unit 21a can be configured to hold a portion, of the lower surface of the substrate 2, different from a portion (center) held by the holding unit 22a of the PA unit 22.

The PA unit 22 can include, for example, the holding unit 22a (rotation unit) which holds and rotates the center of the substrate 2, and an edge detection unit 22b (second detection unit) which detects the edge of the substrate 2 held by the holding unit 22a. A process of detecting the edge position (in the X direction in this embodiment) of the substrate 2 by the edge detection unit 22b while the holding unit 22a rotates the substrate 2, or so-called pre-alignment is performed in the PA unit 22. With this pre-alignment, the notch (orientation flat) position of the substrate 2 in a circumferential direction and the center position of the substrate 2 with respect to the holding unit 22a can be obtained. The edge detection unit 22b which detects the edge of the substrate 2 can include a light-transmissive sensor (for example, a line sensor) (see FIG. 4B) that includes an emitting unit $22b_1$ which emits light and a light-receiving unit $22b_2$ which receives light, out of the light emitted from the emitting unit $22b_1$, that is not shielded by the substrate 2. Such a sensor can be arranged such that the light emitted from the emitting unit $22b_1$ is partially blocked by the substrate 2 and can detect the edge position (the X direction in this embodiment) of the substrate 2 based on the intensity distribution of the light entering the light-receiving unit $22b_2$.

The second conveyance unit 21b conveys the substrate 2 which has undergone pre-alignment from the PA unit 22 to the loading position A (on the stage 12). The second conveyance unit 21b can include, for example, a hand $21b_1$ which holds the substrate 2 and a driving mechanism $21b_2$ which drives the hand $21b_1$ in the Z direction or the Y direction. The hand $21b_1$ of the second conveyance unit 21b is configured to hold the substrate 2 differently from the hand $21a_1$ of the first conveyance unit 21a and to hang the substrate 2 by holding the peripheral portion of the lower surface of the substrate 2. The driving mechanism $21b_2$ stretches/contracts a support shaft $21b_3$ which supports the hand $21b_1$ in the Z direction when driving the hand $21b_1$ in the Z direction and moves the support shaft $21b_3$ in the Y direction (along a guide member which extends in the Y direction) when driving the hand $21b_1$ in the Y direction. In the conveyance apparatus 20 of this embodiment, the first conveyance unit 21a and the second conveyance unit 21b have the different arrangements. However, the present invention is not limited to this. For example, the first conveyance unit 21a and the second conveyance unit 21b may have the same arrangement.

In the conveyance apparatus 20 thus configured, if warpage occurs in the substrate 2 on which a pattern is to be formed, the substrate 2 may contact a member in the lithography apparatus and be damaged while the substrate 2 is conveyed from the PA unit 22 to the stage 12. It is therefore preferable in the conveyance apparatus 20 that conveyance of the substrate 2 to the stage 12 is controlled after grasping the shape of the substrate 2 in order to avoid the substrate 2 from contacting the member in the lithography apparatus. To achieve this, the conveyance apparatus 20 of this embodiment includes a detection unit 24 which detects the height of the substrate 2 and controls conveyance of the substrate 2 to the stage 12 based on a detection result of the detection unit 24. A detection area 24a of the detection unit 24 is set on a path (on the first path) where the first conveyance unit 21a conveys the substrate 2 to the PA unit 22. The detection unit 24 receives reflected light from a part of the substrate 2 when the part falls (stays) within the detection area 24a while the substrate 2 is conveyed. Based on a light-reception result, the detection unit 24 detects the height of a portion of the substrate 2 which falls within the detection area 24a. Then, the conveyance apparatus 20 (control unit 25) generates shape information of the substrate 2 from the detection result of the detection unit 24 and in accordance with the shape information, decides a path (second path) where the second conveyance unit 21b conveys the substrate 2 from the PA unit 22 to the stage 12. The configuration and arrangement of the detection unit 24 will be described below.

Figure 4A:
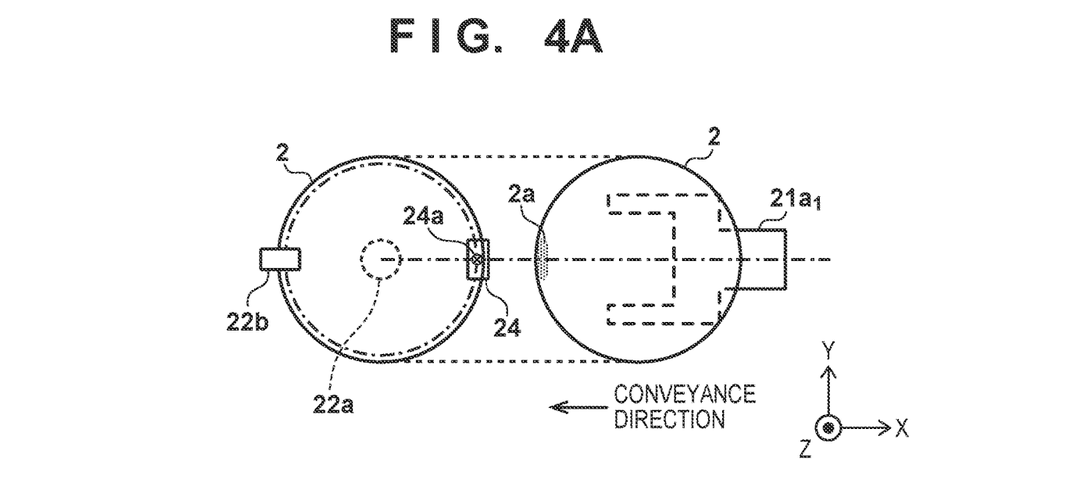
FIG. 4A is a view for explaining the arrangement of a detection unit.
Figure 4B:
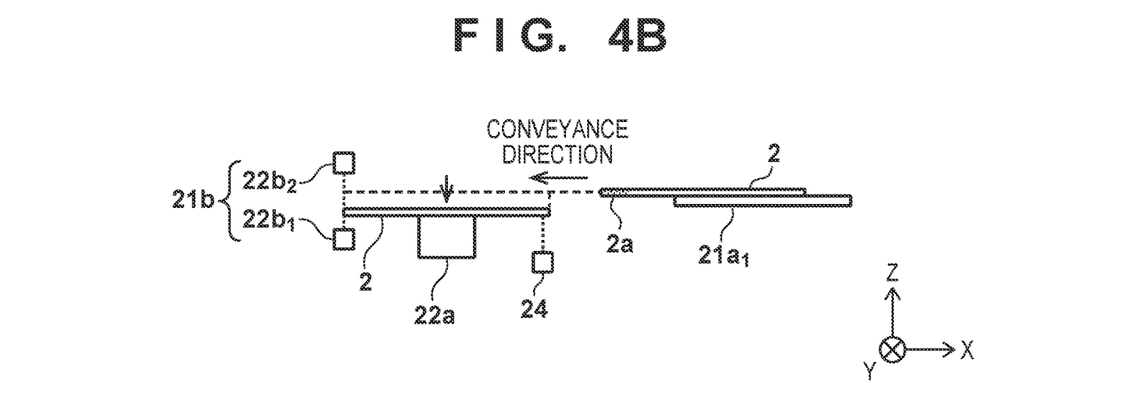
FIG. 4B is a view for explaining the arrangement of the detection unit.

FIGS. 4A and 4B are views for explaining the detection unit 24 and showing the peripheral arrangement of the PA unit 22. FIG. 4A is a view showing the periphery of the PA unit 22 as viewed in the Z direction. FIG. 4B is a view showing the periphery of the PA unit 22 as viewed in the -Y direction. The detection unit 24 detects the height of the substrate 2 by, for example, measuring the distance from the detection unit 24 to the substrate 2. The detection unit 24 of this embodiment can include a sensor, such as a laser interferometer or the like, which emits light to the detection area 24a and detects the height (the position in the Z direction) of a portion of the substrate 2 which falls within the detection area 24a with light reflected by the portion. That is, the detection area 24a can be an area on an optical path of the light emitted from the detection unit 24. Note that the detection unit 24 is not limited to a sensor which detects the height of the substrate 2 with light, but may include, for example, a sensor which detects the height of the substrate 2 by using a capacitance.

The detection unit 24 can be arranged such that, for example, the detection area 24a is set in a part of the substrate held by the holding unit 22a. The detection unit 24 is preferably arranged such that the detection area 24a is set (positioned) in an area having the large warpage of the substrate 2 in a state in which the holding unit 22a holds the substrate 2. The area having the large warpage of the substrate 2 whose edge is detected by the edge detection unit 22b is a portion closer to the rotation center of the substrate 2 (the end portion of the substrate 2) than a portion (periphery) of the substrate 2. The detection unit 24 is preferably arranged so as to set the detection area 24a in a range inside the edge of the substrate 2 and within 10 nm from the edge, and more preferably in a range inside the edge of the substrate 2 and within 5 nm from the edge. By thus arranging the detection unit 24, the control unit 25 can obtain the height distribution of the substrate 2 in the circumferential direction (the height distribution of the end portion of the substrate 2 in the circumferential direction) from a detection result of the detection unit 24 obtained while rotating the substrate 2 in pre-alignment.

The detection unit 24 can also be arranged such that the substrate 2 (more preferably, the center of the substrate 2) passes through the detection area 24a while the first conveyance unit 21a conveys the substrate 2. By thus arranging the detection unit 24, the control unit 25 can obtain the height distribution of the substrate 2 in a conveyance direction (X direction (radial direction)) from a detection result of the detection unit 24 obtained while the first conveyance unit 21a conveys the substrate 2.

An example will be described in which the detection unit 24 of this embodiment is arranged such that the substrate 2 passes through the detection area 24a (in optical path area of the detection unit 24) while the first conveyance unit 21a conveys the substrate 2. However, the present invention is not limited to this. For example, the detection unit 24 may be arranged such that the substrate 2 passes through the detection area 24a while the second conveyance unit 21b conveys the substrate 2. Further, in FIGS. 4A and 4B, the detection unit 24 is arranged on the lower-surface side of the substrate 2 so as to detect the height of the reverse surface (-Z-direction surface) of the substrate 2. However, the detection unit 24 may be arranged on the upper-surface side of the substrate 2 so as to detect the height of the obverse surface (Z-direction surface) of the substrate 2.

Figure 5:
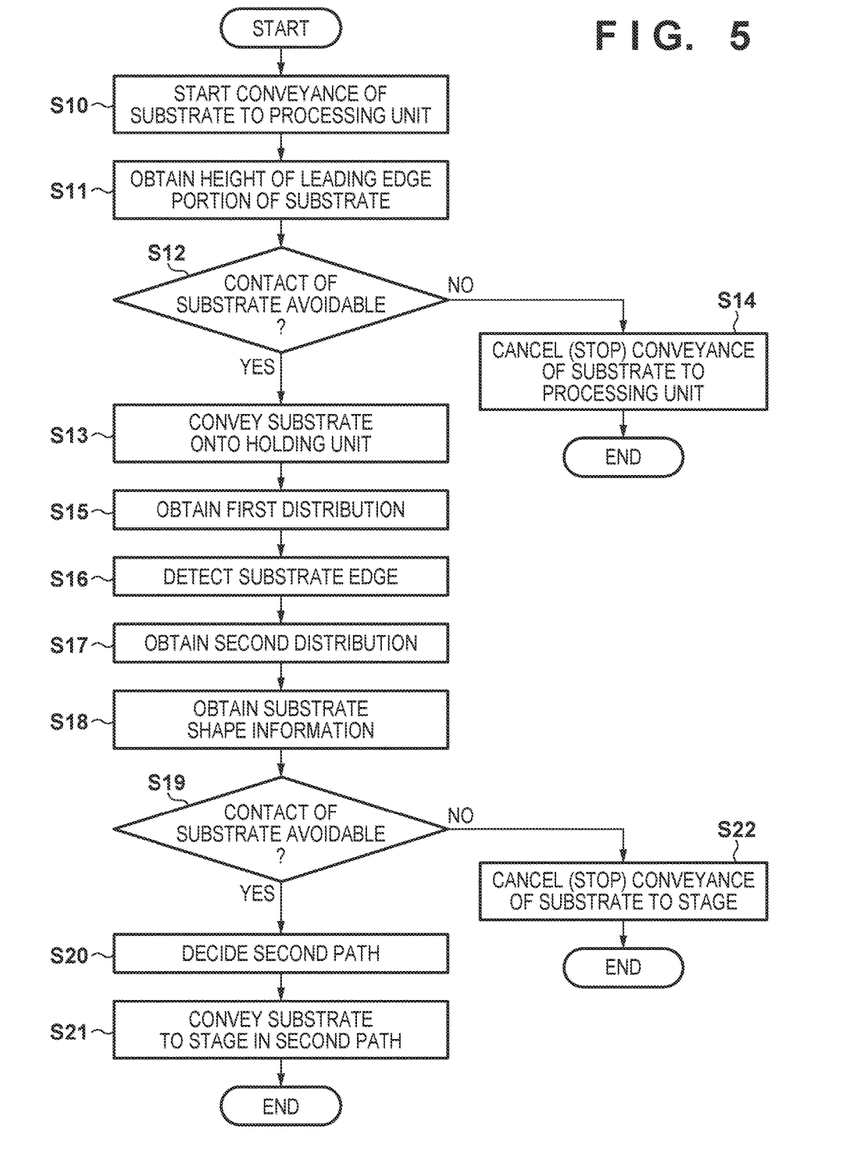
FIG. 5 is a flowchart showing a method of conveying a substrate to a stage.

A method of conveying the substrate 2 to the stage 12 will now be described with reference to FIG. 5. FIG. 5 is a flowchart showing the method of conveying the substrate 2 to the stage 12. The control unit 25 can control respective steps of the flowchart shown in FIG. 5.

In step S10, the control unit 25 controls the first conveyance unit 21a so as to start conveying the substrate 2 from the standby position C to the PA unit 22. In step S11, the control unit 25 obtains, from the detection unit 24, the height of a portion (to be referred to as an edge portion 2a hereinafter) which first falls within the detection area 24a of the detection unit 24 when the first conveyance unit 21a conveys the substrate 2. In step S12, based on the height of the edge portion 2a of the substrate 2, the control unit 25 determines whether it is possible to avoid the substrate 2 from contacting the edge portion 2a when the first conveyance unit 21a conveys the substrate 2 onto the holding unit 22a. Then, if the control unit 25 determines that it is possible to avoid the substrate 2 from contacting the holding unit 22a, the process advances to step S13. Steps S11 and S12 can be performed before the edge portion 2a of the substrate 2 reaches on the holding unit 22a. In step S13, the control unit 25 causes the first conveyance unit 21a to convey the substrate 2 onto the holding unit 22a.

Figure 6:
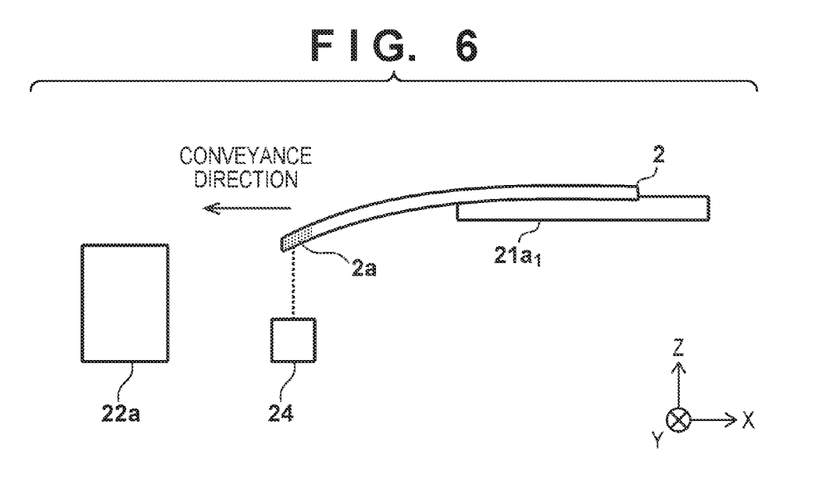
FIG. 6 is a view showing a state in which the first conveyance unit holds the substrate.

For example, the substrate 2 may have warpage (shape) which is concave upward. When the first conveyance unit 21a conveys the substrate 2 having such warpage, the height of the edge portion 2a of the substrate 2 may become lower than the hand $21a_1$ of the first conveyance unit 21a as shown in FIG. 6. In this case, the control unit 25 determines, based on the height of the edge portion 2a of the substrate 2, whether it is possible to avoid the substrate 2 from contacting the holding unit 22a by driving the first conveyance unit 21a and the holding unit 22a. Driving of the first conveyance unit 21a and the holding unit 22a can include, for example, making the hand $21a_1$ of the first conveyance unit 21a higher than usual, making the holding surface of the holding unit 22a lower than usual, or the like. Then, when the control unit 25 determines that it is possible to avoid the substrate 2 from contacting the holding unit 22a, the process advances to step S13. In step S13, the control unit 25 controls conveyance of the substrate 2 to the PA unit 22 by the first conveyance unit 21a so as to avoid the substrate 2 from contacting the holding unit 22a by driving the first conveyance unit 21a and the holding unit 22a.

On the other hand, driving of the first conveyance unit 21a and the holding unit 22a also has its limit, and thus depending on the magnitude of the warpage of the substrate 2 (the height of the edge portion 2a of the substrate 2), the substrate 2 may contact the holding unit 22a even if driving them. In this case, the control unit 25 determines in step S12 that it is impossible to avoid the substrate 2 from contacting the holding unit 22a even by driving the first conveyance unit 21a and the holding unit 22a, and then the process advances to step S14 in which conveyance of the substrate 2 to the PA unit 22 (holding unit 22a) is canceled (stopped). The first conveyance unit 21a conveys the substrate 2 whose conveyance to the PA unit 22 is canceled (stopped) to the cassette arranged at the standby position C.

Figure 7A:
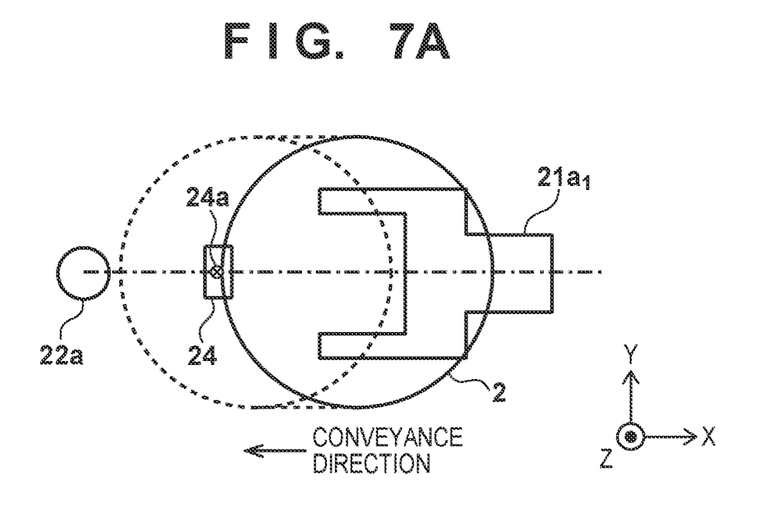
FIG. 7A is a view when the first distribution is obtained.
Figure 7B:
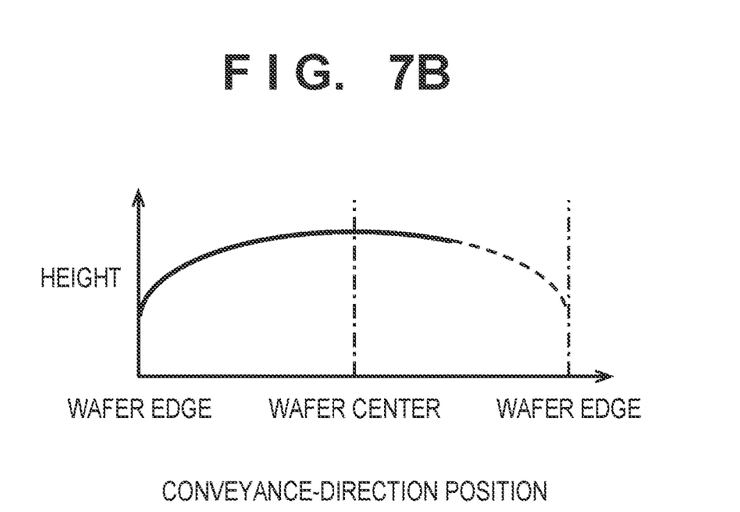
FIG. 7B is a graph showing the first distribution.

In step S15, the control unit 25 obtains the height distribution (first distribution) of the substrate 2 in the conveyance direction from a detection result of the detection unit 24 obtained by the fact that the substrate 2 passes through the detection area 24a of the detection unit 24 while the first conveyance unit 21a conveys the substrate 2 as shown in FIG. 7A. For example, as shown in FIG. 7B, the first distribution can be represented by the relationship between the height (the position in the Z direction) and the position in the conveyance direction (the position in the X direction) in the substrate.

Figure 8A:
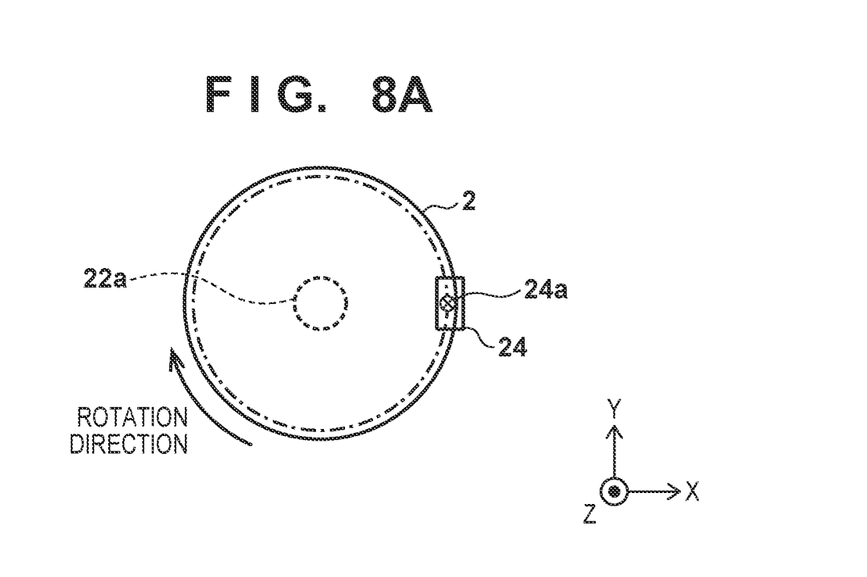
FIG. 8A is a view when the second distribution is obtained.
Figure 8B:
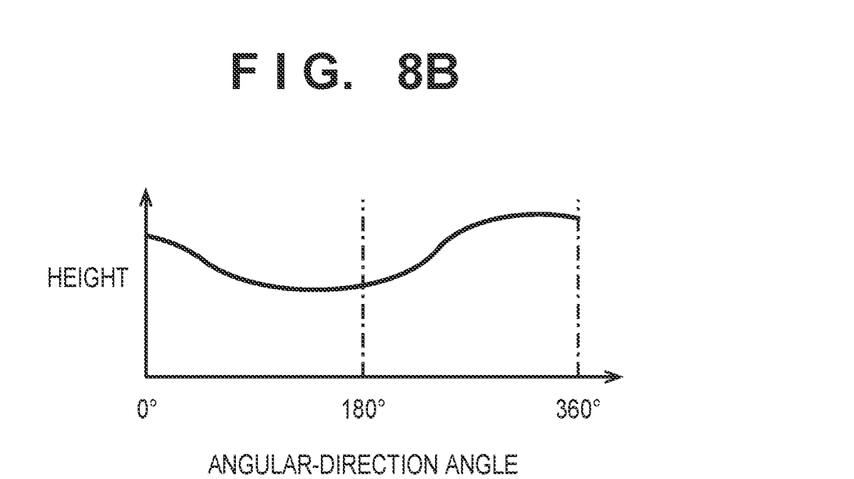
FIG. 8B is a graph showing the second distribution.

In step S16, the control unit 25 detects the edge of the substrate 2 (perform pre-alignment) by the edge detection unit 22b while the holding unit 22a rotates the substrate 2. At this time, as shown in FIG. 8A, the detection unit 24 detects the height of the portion of the substrate 2 which falls within the detection area 24a while the holding unit 22a rotates the substrate 2. That is, the detection unit 24 performs detection while rotating the substrate 2 in order to detect the edge of the substrate 2. Therefore, the control unit 25 obtains the height distribution (second distribution) of the substrate in the circumferential direction from a detection result of the detection unit 24 obtained while detecting the edge of the substrate 2 in step S17. For example, as shown in FIG. 8B, the second distribution can be represented by the relationship between the height and an circumferential direction angle (rotation angle) in the substrate. In this embodiment, the height distribution of the substrate 2 in an entire circumference in the circumferential direction is obtained. However, the height distribution may not be obtained in the entire circumference.

Figure 9:
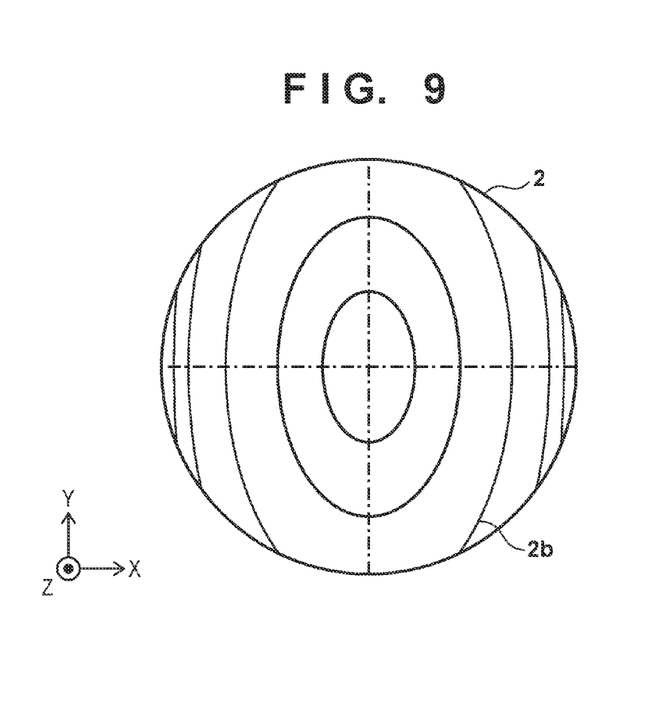
FIG. 9 is a view showing substrate shape information.

In step S18, based on the first distribution obtained in step S15 and the second distribution obtained in step S17, the control unit 25 obtains information (shape information) indicating the shape (warpage) of the substrate 2 as shown in, for example, FIG. 9. FIG. 9 is a view showing the shape information of the substrate 2. Lines 2b in the substrate represent contour lines. In this embodiment, both the first distribution and the second distribution are used when the shape information of the substrate 2 is obtained. However, the present invention is not limited to this. For example, only one of the first distribution and the second distribution may be used. When the shape information of the substrate 2 is obtained, a detection result of the edge detection unit 22b (edge information of the substrate 2) may further be used. By further using the edge information of the substrate 2 as described above, the shape information of the substrate 2 can be obtained more accurately.

In step S19, based on the shape information of the substrate 2, the control unit 25 determines whether it is possible to avoid the substrate 2 from contacting the member in the imprint apparatus when the second conveyance unit 21b conveys the substrate 2 onto the stage 12. Then, if the control unit 25 determines that it is possible to avoid the substrate 2 from contacting the member in the imprint apparatus, the process advances to step S20. In step S20, based on the shape information of the substrate 2, the control unit 25 controls conveyance of the substrate 2 to the stage 12 by the second conveyance unit 21b so as to avoid the substrate 2 from contacting the member in the imprint apparatus. For example, the control unit 25 decides a conveyance path (second conveyance path) where the substrate 2 is conveyed to the stage 12 so as to avoid the substrate 2 from contacting the member in the imprint apparatus. Then, in step S21, the control unit 25 causes the second conveyance unit 21b to convey the substrate 2 onto the stage 12 in the second path decided in step S20.

Figure 10:
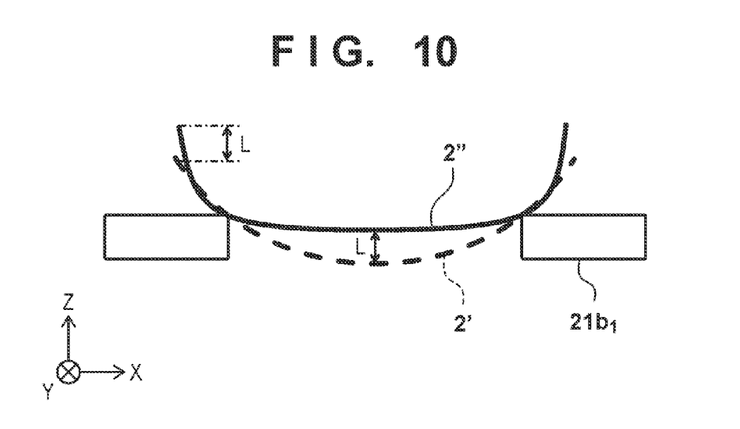
FIG. 10 is a view showing a state in which two substrates different in shape are held.

For example, in the conveyance apparatus 20, the position of the center of the substrate 2 and the position of the peripheral portion (outer edge portion) of the substrate can be different depending on the warpage (shape) of the substrate 2 when the substrate 2 is conveyed. FIG. 10 is a view showing a state as viewed in the Y direction in which the hand $21b_1$ of the second conveyance unit 21b holds each of two substrates 2 (a substrate 2' and a substrate 2") different in shape. As shown in FIG. 10, in the state in which the hand $21b_1$ of the second conveyance unit 21b holds the substrate 2', the heights of the substrate in the center and the peripheral portion are different by L as compared with the state in which the hand $21b_1$ holds the substrate 2". Accordingly, when the substrate 2' is conveyed onto the stage in the same path as the path for conveying the substrate 2" to the stage 12, the substrate 2' may contact the member in the imprint apparatus such as the pins 12a protruding from the stage 12. Therefore, the conveyance apparatus 20 of this embodiment obtains the shape information of the substrate 2 from the detection result of the detection unit 24 and based on the obtained shape information, obtains the state (position) of the substrate when held by the conveyance unit 21 (second conveyance unit 21b). This makes it possible to decide the second path when the substrate 2 is conveyed onto the stage so as to avoid the substrate 2 from contacting the member in the imprint apparatus.

Note that it is preferable, in terms of throughput, that the control unit 25 decides, in step S20, the second path to be the shortest path where the substrate 2 does not contact the member in the imprint apparatus. Further, the control unit 25 may also control the protrusion amount of the pins 12a protruding from the stage 12 (for example, may reduce the protrusion amount) in accordance with the shape information of the substrate 2. Furthermore, the conveyance apparatus 20 may include a correction unit which corrects the shape of the substrate 2 arranged on the stage. In this case, after the substrate 2 is conveyed onto the stage, the control unit 25 may decide, in accordance with the shape information of the substrate 2, whether the correction unit needs to correct the warpage of the substrate 2.

On the other hand, if the control unit 25 determines in step S19 that it is impossible to avoid the substrate 2 from contacting the member in the imprint apparatus, the process advances to step S22 in which conveyance of the substrate 2 to the stage 12 is canceled (stopped). The first conveyance unit 21a conveys the substrate 2 whose conveyance to the stage 12 is canceled (stopped) to the cassette arranged at the standby position C.

As described above, the conveyance apparatus 20 of this embodiment includes the detection unit 24 which detects the height of the substrate 2 and controls, based on the detection result of the detection unit 24, conveyance of the substrate 2 to the stage 12. This makes it possible to avoid the substrate 2 from contacting the member in the imprint apparatus and being damaged when the substrate 2 is conveyed from the PA unit 22 onto the stage.

Second Embodiment

Figure 11A:
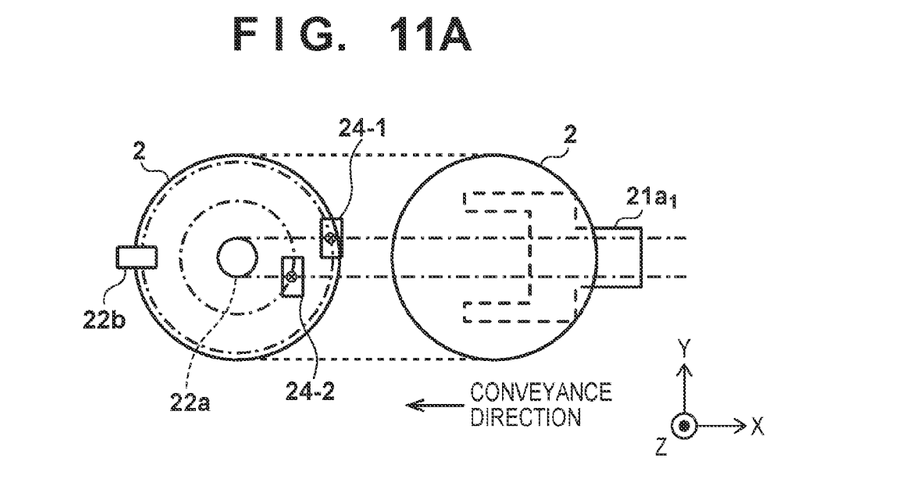
FIG. 11A is a view for explaining the arrangement of two detection units.
Figure 11B:
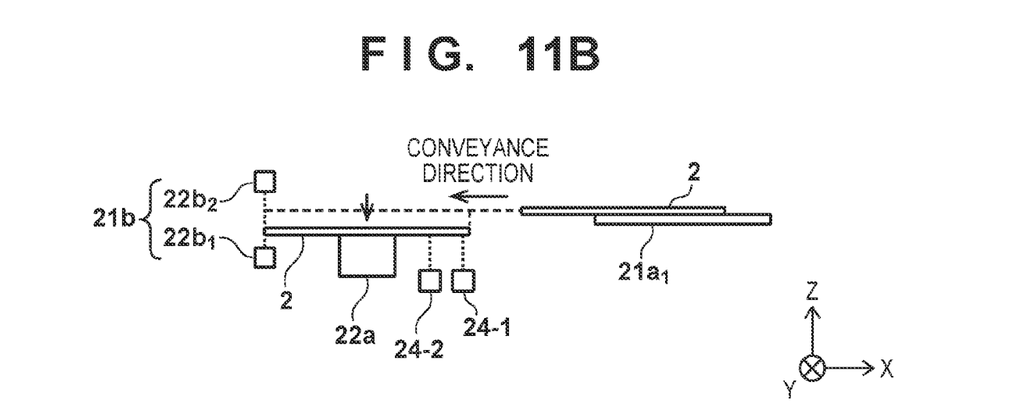
FIG. 11B is a view for explaining the arrangement of two detection units.

In the second embodiment, an example will be described in which a plurality of detection units 24 are provided with reference to FIGS. 11A and 11B. An example will be described in which two detection units (24-1 and 24-2) are provided. However, three or more detection units 24 may be provided. FIGS. 11A and 11B are views for explaining the arrangement of two detection units 24, and showing the peripheral arrangement of a PA unit 22. FIG. 11A is a view showing the periphery of the PA unit 22 as viewed in the Z direction. FIG. 11B is a view showing the periphery of the PA unit 22 as viewed in the −Y direction.

As shown in FIGS. 11A and 11B, the plurality of detection units 24 are preferably arranged such that the positions of detection areas 24a are shifted from each other in a direction (Y direction) perpendicular to the conveyance direction of a substrate 2 by a first conveyance unit 21a. Further, the plurality of detection units 24 are preferably arranged so as to each have the different distance between the detection area 24a and the rotation center of the substrate 2 (for example, the center of the substrate 2) by a holding unit 22a in edge detection. By using the plurality of detection units 24 thus arranged, the shape information of the substrate 2 can be obtained more accurately from a detection result of each detection unit 24.

Embodiment of Method of Manufacturing Article

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern in an imprint material (resist) supplied to a substrate using the above-described imprint apparatus, and a step of processing the substrate on which the pattern has been formed in the preceding step. The aforementioned other lithography apparatus may be used instead of the imprint apparatus. This manufacturing method further includes other known steps (oxidation, deposition, vapor deposition, doping, planarization, etching, resist removal, dicing, bonding, packaging, and the like). The method of manufacturing the article according to this embodiment is superior to a conventional method in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-073179 filed on Mar. 31, 2016, which is hereby incorporated by reference herein in its entirety.

What is claimed is:

1. A conveyance apparatus which conveys a substrate to a stage, the apparatus comprising:
   a holding unit configured to hold the substrate;
   a first conveyance unit configured to convey the substrate to the holding unit;
   a second conveyance unit configured to convey the substrate from the holding unit to the stage;
   a detection unit configured to detect a height of the substrate held by the holding unit, wherein the detection unit is arranged to be capable of detecting the height of the substrate while the first conveyance unit conveys the substrate to the holding unit; and
   a controller configured to:
      obtain a first distribution indicating a height distribution of the substrate in a conveyance direction of the substrate by the first conveyance unit, by causing the detection unit to detect the height of the substrate while the first conveyance unit conveys the substrate; and
      cause the second conveyance unit to convey the substrate in accordance with a conveyance path determined based on the obtained first distribution.

2. The apparatus according to claim 1, wherein the detection unit includes a plurality of detectors each of which is configured to detect a height of the substrate, the plurality of detectors being arranged to be displaced from each other in a different direction from the conveyance direction.

3. The apparatus according to claim 1, wherein the controller is configured to determine the conveyance path so as to avoid the substrate from contacting with the stage, based on the first distribution.

4. The apparatus according to claim 1, wherein the controller is configured to cancel conveyance of the substrate by the first conveyance unit, in a case where contact of the substrate and the holding unit during the conveyance of the substrate by the first conveyance unit is predicted based on a detection result by the detection unit.

5. A conveyance apparatus which conveys a substrate to a stage, the apparatus comprising:
   a holding unit configured to hold and rotate the substrate;
   a detection unit configured to detect a height of the substrate;
   a first conveyance unit configured to convey the substrate to the holding unit;
   a second conveyance unit configured to convey the substrate from the holding unit to the stage; and
   a controller configured to:
      obtain a first distribution indicating a height distribution of the substrate in a conveyance direction of the substrate by the first conveyance unit, by causing the detection unit to detect the height of the substrate while the first conveyance unit conveys the substrate,
      obtain a second distribution indicating a height distribution of the substrate in a circumferential direction of the substrate, by causing the detection unit to detect the height of the substrate while the holding unit holds and rotates the substrate; and
      cause the second conveyance unit to convey the substrate in accordance with a conveyance path determined based on the obtained first distribution and second distribution.

6. The apparatus according to claim 5, wherein the controller is configured to control a protrusion amount of pins to be protruded from the stage when transferring the substrate from the second conveyance unit onto the stage, based on the second distribution.

7. The apparatus according to claim 5, wherein the detection unit includes a plurality of detectors each of which is configured to detect a height of the substrate, the plurality of detectors being arranged so as to each have a different distance between a detection area of a height of the substrate and a center of rotation by the holding unit.

8. The apparatus according to claim 5, wherein the controller is configured to determine the conveyance path so as to avoid the substrate from contacting with the stage, based on the first distribution and the second distribution.

9. The apparatus according to claim 1, further comprising a second detection unit configured to detect an edge of the substrate while the holding unit holds and rotates the substrate,
   wherein the controller is configured to determine the conveyance path further based on the edge of the substrate detected by the second detection unit.

10. The apparatus according to claim 1, wherein the controller is configured to determine the conveyance path so as to adjust the height of the substrate during conveyance of the substrate by the second conveyance unit.

11. The apparatus according to claim 5, wherein the controller is configured to determine the conveyance path so as to adjust the height of the substrate during conveyance of the substrate by the second conveyance unit.

12. A lithography apparatus which forms a pattern on a substrate, the apparatus comprising:
   a patterning unit including a stage and configured to form a pattern on the substrate held by the stage; and
   a conveyance apparatus configured to convey the substrate to the stage,
   wherein the conveyance apparatus includes:
      a holding unit configured to hold the substrate;
      a first conveyance unit configured to convey the substrate to the holding unit;
      a second conveyance unit configured to convey the substrate from the holding unit to the stage;
      a detection unit configured to detect a height of the substrate held by the holding unit, wherein the detection unit is arranged to be capable of detecting the height of the substrate while the first conveyance unit conveys the substrate to the holding unit; and
      a controller configured to:
         obtain a first distribution indicating a height distribution of the substrate in a conveyance direction of the substrate by the first conveyance unit, by causing the detection unit to detect the height of the substrate while the first conveyance unit conveys the substrate; and
         cause the second conveyance unit to convey the substrate in accordance with a conveyance path determined based on the obtained first distribution.

13. A method of manufacturing an article, the method comprising:
   obtaining, by causing a detection unit to detect a height of a substrate while the substrate is conveyed to a holding unit configured to hold the substrate, a first distribution indicating a height distribution of the substrate in a conveyance direction in which the substrate is conveyed to the holding unit;
   determining a conveyance path in which the substrate is conveyed from the holding unit to a stage, based on the obtained first distribution;
   conveying the substrate from the holding unit to the stage in accordance with the determined conveyance path;
   forming a pattern on the substrate conveyed to the stage;
   processing the substrate, on which the pattern has been formed; and
   obtaining the article including at least a portion of the processed substrate,
   wherein the detection unit is configured to detect the height of the substrate held by the holding unit, and is arranged to be capable of detecting the height of the substrate while the substrate is conveyed to the holding unit.

14. A lithography apparatus which forms a pattern on a substrate, the apparatus comprising:
   a patterning unit including a stage and configured to form a pattern on the substrate held by the stage; and
   a conveyance apparatus configured to convey the substrate to the stage,
   wherein the conveyance apparatus includes:
      a holding unit configured to hold and rotate the substrate;
      a detection unit configured to detect a height of the substrate;
      a first conveyance unit configured to convey the substrate to the holding unit;

a second conveyance unit configured to convey the substrate from the holding unit to the stage; and
a controller configured to:
obtain a first distribution indicating a height distribution of the substrate in a conveyance direction of the substrate by the first conveyance unit, by causing the detection unit to detect the height of the substrate while the first conveyance unit conveys the substrate,
obtain a second distribution indicating a height distribution of the substrate in a circumferential direction of the substrate, by causing the detection unit to detect the height of the substrate while the holding unit holds and rotates the substrate; and
cause the second conveyance unit to convey the substrate in accordance with a conveyance path determined based on the obtained first distribution and second distribution.

15. A method of manufacturing an article, the method comprising:
obtaining, by detecting a height of a substrate while the substrate is conveyed to a holding unit configured to hold and rotate the substrate, a first distribution indicating a height distribution of the substrate in a conveyance direction in which the substrate is conveyed to the holding unit;
obtaining, by detecting the height of the substrate while the substrate is held and rotated by the holding unit, a second distribution indicating a height distribution of the substrate in a circumferential direction of the substrate,
determining a conveyance path in which the substrate is conveyed from the holding unit to a stage, based on the obtained first distribution and second distribution;
conveying the substrate from the holding unit to the stage in accordance with the determined conveyance path;
forming a pattern on the substrate conveyed to the stage;
processing the substrate, on which the pattern has been formed; and
obtaining the article including at least portion of the processed substrate.

16. A method of conveying a substrate to a stage, the method comprising:
obtaining, by causing a detection unit to detect a height of a substrate while the substrate is conveyed to a holding unit configured to hold the substrate, a first distribution indicating a height distribution of the substrate in a conveyance direction in which the substrate is conveyed to the holding unit;
determining a conveyance path in which the substrate is conveyed from the holding unit to a stage, based on the obtained first distribution; and
conveying the substrate from the holding unit to the stage, in accordance with the determined conveyance path,
wherein the detection unit is configured to detect the height of the substrate held by the holding unit, and is arranged to be capable of detecting the height of the substrate while the substrate is conveyed to the holding unit.

17. A method of conveying a substrate to a stage, the method comprising:
obtaining, by detecting a height of a substrate while the substrate is conveyed to a holding unit configured to hold and rotate the substrate, a first distribution indicating a height distribution of the substrate in a conveyance direction in which the substrate is conveyed to the holding unit;
obtaining, by detecting the height of the substrate while the substrate is held and rotated by the holding unit configure to hold and rotate the substrate, a second distribution indicating a height distribution of the substrate in a circumferential direction of the substrate;
determining a conveyance path in which the substrate is conveyed from the holding unit to a stage, based on the obtained first distribution and second distribution; and
conveying the substrate from the holding unit to the stage in accordance with the determined conveyance path.

18. A conveyance apparatus which conveys a substrate to a stage, the apparatus comprising:
a holding unit configured to hold and rotate the substrate;
a conveyance unit configured to convey the substrate from the holding unit to the stage;
a detection unit configured to detect a height of a portion of the substrate within a detection area of the detection unit, the detection unit arranged such that the substrate passes through the detection area while the conveyance unit conveys the substrate; and
a controller configured to control conveyance of the substrate by the conveyance unit based on a first detection result of the detection unit obtained when the conveyance unit conveys the substrate and a second detection result of the detection unit obtained while the holding unit rotates the substrate.

19. A conveyance apparatus which conveys a substrate to a stage, the apparatus comprising:
a holding unit configured to hold and rotate the substrate;
a first conveyance unit configured to convey the substrate to the holding unit;
a second conveyance unit configured to convey the substrate from the holding unit to the stage;
a detection unit configured to detect a height of a portion of the substrate within a detection area of the detection unit, the detection unit arranged such that the substrate passes through the detection area while the first conveyance unit conveys the substrate; and
a controller configured to control conveyance of the substrate by the second conveyance unit based on a first detection result of the detection unit obtained while the holding unit rotates the substrate and a second detection result of the detection unit obtained while the first conveyance unit conveys the substrate.

20. The apparatus according to claim 1, wherein the detection unit is arranged to be capable of detecting, as the first distribution, the height distribution of the substrate on a straight line across the substrate while the first conveyance unit conveys the substrate.

21. The apparatus according to claim 1, wherein the detection unit is arranged to be capable of detecting, as the first distribution, the height distribution of the substrate in a radial direction while the first conveyance unit conveys the substrate.

* * * * *